United States Patent [19] [11] 4,255,714
Rosen [45] Mar. 10, 1981

[54] GAAS DUAL-GATE FET FREQUENCY DISCRIMINATOR

[75] Inventor: Arye Rosen, Cherry Hill, N.J.
[73] Assignee: RCA Corporation, New York, N.Y.
[21] Appl. No.: 13,604
[22] Filed: Feb. 21, 1979
[51] Int. Cl.³ .............................................. H03D 3/26
[52] U.S. Cl. .................... 329/103; 307/522; 328/140; 329/116; 329/119; 329/134; 329/192; 329/205 R; 330/277
[58] Field of Search .............. 329/103, 116, 119, 134, 329/192, 205 R, 206; 307/233 R; 328/140; 330/277; 325/349

[56] References Cited

U.S. PATENT DOCUMENTS

| | | | |
|---|---|---|---|
| 4,053,841 | 10/1977 | Rosen et al. | 329/103 |
| 4,053,842 | 10/1977 | Turski et al. | 329/103 |
| 4,110,700 | 8/1978 | Rosen et al. | 329/103 |

OTHER PUBLICATIONS

Maeda et al., "Microwave Variable-Gain Amplifier with Dual-Gate GaAs FET", IEEE Transactions on Microwave Theory and Techniques, vol. MTT-22, No. 12, Dec. 1974, pp. 1226-1230.

Primary Examiner—Siegfried H. Grimm
Assistant Examiner—Edward P. Westin
Attorney, Agent, or Firm—Samuel Cohen; Robert L. Troike

[57] ABSTRACT

A microwave frequency discriminator comprising a dual-gate field effect transistor (FET) amplifier, bias circuits and a detector. The FET is biased to produce an output RF signal within a predetermined frequency bandwidth in response to an input RF signal. A limiter provides a substantially constant power level of the input RF signal to the FET. A detector biasing circuit is used to match electronically the output impedance of the FET to the input impedance of the detector. At such impedance conditions a dc output voltage of the detector varies substantially linearly throughout the frequency bandwidth as a function of the frequency of the input RF signal, approximating the characteristic of a frequency discriminator.

10 Claims, 3 Drawing Figures

GAAS DUAL-GATE FET FREQUENCY DISCRIMINATOR

BACKGROUND OF THE INVENTION

1. Field of the Invention

This invention relates to a microwave frequency discriminator and more particularly to a discriminator comprising a dual-gate field effect transistor including biasing circuits for obtaining electronically predetermined transistor input and output impedance conditions.

2. Description of the Prior Art

Techniques and devices for the rapid and accurate determination of an unknown signal frequency are of significant interest in modern communication systems, in particular for electronic counter measure (ECM) systems operating at microwave frequencies. Microwave frequency discriminators capable of converting incoming unknown frequencies into voltages for processing are often used in ECM systems. A microwave frequency discriminator may be defined as a circuit that provides an output voltage which is a predetermined function of, and usually proportional to, the frequency of an incoming signal. The discriminator voltage output versus frequency response, commonly termed the "discriminator characteristic," is the response in which the output voltage varies nearly linearly with respect to frequency over a predetermined frequency bandwidth. The bandwidth is generally determined by the slope, linearity, and resolution of the discriminator and is the frequency range over which the descriminator provides an unambiguous voltage output which is related to the input frequency.

A typical broadband microwave discriminator often utilized in modern systems comprises passive elements such as transmission lines or an arrangement of lumped elements to vary the power level of the input signal applied to a detector diode as a function of frequency. Such a disciminator formed of various passive components, generally has, disadvantageously, a large number of connections between the components. These interconnections often produce impedance mismatches resulting in undesirable inflection points in the relation between input frequency and output voltage such that a particular voltage can occur at several frequencies. Such distortions in the discriminator characteristic limit the broadband resolution of the discriminator minimizing thereby the accuracy of the system.

To overcome such discriminator deficiencies, recent advances in the art have resulted in the minimization or elimination of the passive elements and the utilization instead of active elements, such as field effect transistors, to achieve the discriminator characteristic. As disclosed in U.S. Pat. Nos. 4,053,841, entitled, "Improved Microwave Frequency Discriminator Comprising An FET Amplifier," by A. Rosen et al., and 4,053,842, entitled, "Microwave Frequency Discriminator Comprising An FET Amplifier," by Z. Turski, FETs are arranged to produce an output voltage that varies substantially linearly with the frequency of an input RF signal throughout a certain frequency bandwidth. The impedance conditions for obtaining the discriminator characteristic with the FET are achieved in the aforementioned U.S. Pat. No. 4,053,842 by input and output shaping networks, and in U.S. Pat. No. 4,053,841 by an input shaping network and an output biasing circuit. The shaping networks in each patent are typically arranged in microstrip form with the geometric shape of the network determining the impedance condition. The configuration for providing a desirable impedance is selected for a specific range of discriminator operating conditions. The configuration of the shaping networks for a given set of discriminator parameters is obtained by the use of computer iteration techniques to determine the particular geometric pattern. Fine tuning of the discriminator characteristic is achieved by manually varying the location of tuning stubs on the microstrip circuit.

Although an improvement over the passive element type discriminator, the FET discriminator utilizing particularly configured shaping networks disadvantageously requires a selection process for determining the network geometry and thereby its impedance as well as the manual process of tuning by the manipulation of tuning elements or stubs. Such processes restrict the discriminator performance to a limited range of operating conditions since, once the configuration of the networks is determined, it is fixed, subject only to minimal adjustments by manual tuning. Manual tuning is problematical in such applications as well, since once the discriminator is in its intended operating environment, lack of accessibility may prohibit any further manual tuning.

It is further known in the microwave art that the problematical manual tuning may be replaced by electronic tuning provided by a FET amplifier including an electronic variable capacitor (varactor), a biasing circuit and a detector. Such a circuit is described in U.S. Pat. No. 4,110,700, entitled "Electronically Tunable Microwave Frequency FET Discriminator," by A. Rosen et al. There remains a need in the microwave art to provide an electronically tunable FET discriminator that operates without the use of an electronic variable capacitor such as a varactor.

SUMMARY OF THE INVENTION

According to the present invention, a microwave frequency discriminator comprises a transistor amplifier including a dual-gate field effect transistor having first, second, third and fourth electrodes. The amplifier has an input port of receiving an input RF signal of substantially constant power level and an output port. The first, second and third electrodes are biased by predetermined voltages for producing a response as a function of the input RF signal. This response is an output RF signal having a predetermined frequency vs. gain roll-off characteristic within a predetermined frequency bandwidth. A detector responsive to the output RF signal generates a dc signal. Biasing means responsive to a predetermined bias voltage are included for matching the output impedance of the transistor with the input impedance to the detector. At such impedance conditions, the voltage of the dc signal varies substantially linearly as a function of the frequency of the input RF signal.

In an environment of a wide band RF signal of varying power level, a limiting means may be used to provide to the amplifier, an RF signal of substantially constant power level.

DETAILED DESCRIPTION OF THE PREFERRED EMBODIMENT

Figure 1:
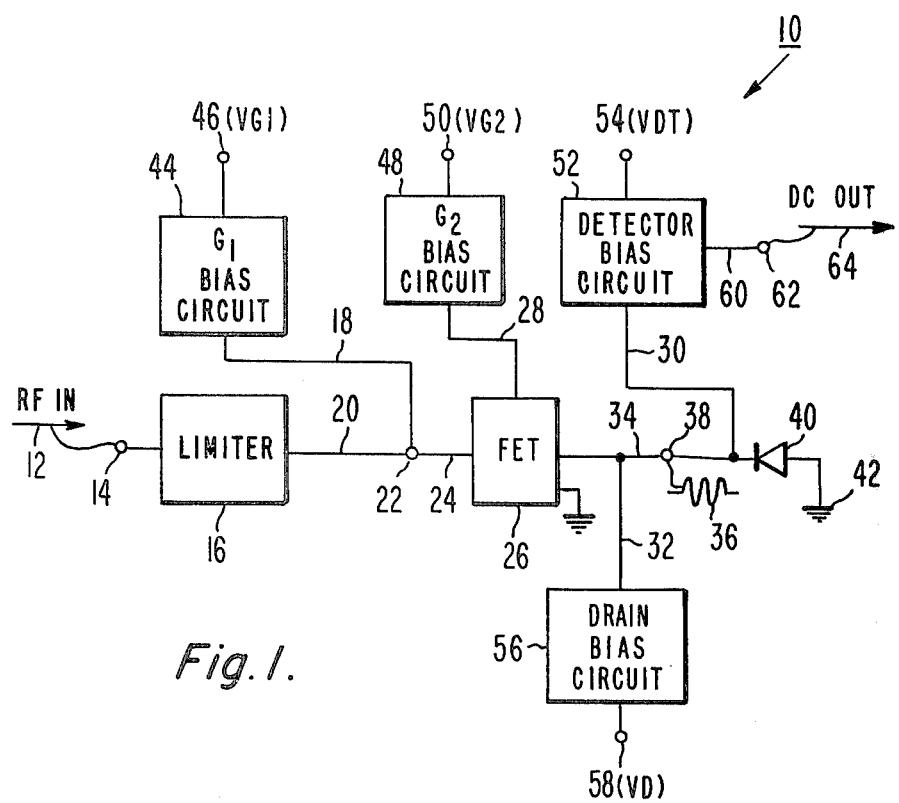
FIG. 1 is a block schematic of a microwave frequency discriminator of the present invention.

Referring to the drawing, there is shown in FIG. 1, a block schematic of one embodiment of a microwave frequency discriminator 10. Discriminator 10 includes a limiter 16, a dual-gate field effect transistor (FET) 26, having an input port 22 and an output port 38, biasing circuits 44, 48, 52 and 56, and a detector diode 40, such as a beam lead Schottky diode.

An input RF signal 12 of unknown frequency, which may be of variable power level, is applied to the input 14 and processed by limiter 16. The function of limiter 16 is to provide an output RF signal on signal path 20 having a predetermined power level which is invariant with the power level and frequency of the incoming signal 12, so that it may be processed as hereinafter described. Limiter 16 is suitably a tunnel diode amplifier (TDA) coupled to a three-port circulator. It should be appreciated and understood that limiter 16 may be unnecessary and therefore eliminated if the incoming RF signal 12 has a relatively constant power level.

In a preferred embodiment of the invention, FET 26 is a gallium-arsenide (GaAs) Schottky barrier dual-gate field effect transistor chosen for its desirable high gain properties in a selected frequency range, although any dual-gate FET device may be used.

Dual-gate FETs provide desirable functional advantages over the known prior art devices, in particular, the single gate FET. The dual-gate structure, which, in addition to increased gain and stability, has enhanced functions due to the presence of two independent control gates. A device having the second gate with a deeper pinch-off voltage has been found to control (1) noise, (2) stability, and (3) gain at microwave frequencies.

Figure 2:
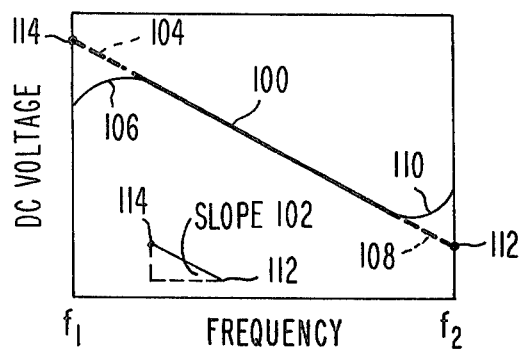
FIG. 2 is a graph showing dc voltage versus frequency, useful in describing the present invention.

According to the present invention, the input impedance to the dual-gate FET 26 is varied by changing the bias voltage to a first gate (G1) of FET 26. The output impedance of FET 26 is varied by the bias voltage of a second gate (G2) of FET 26. The output impedance of the FET 26 is further matched to a detector 40 by varying the bias voltages of a drain (D) of FET 26 and the detector 40. FET 26 is arranged to operate as a transistor amplifier such that the application of the varying bias voltages is to "linearize" end portions 106 and 110 to portions 104 and 108, respectively, as shown in FIG. 2, to approximate a linear frequency discriminator characteristic through a frequency range from f1 to f2. The frequency characteristic is shown as a straight line comprising portions 104, 100 and 108 having a slope 102. The slope 102 between points 112 and 114 is substantially determined by the gain of FET 26 in conjunction with the drain voltage and the detector current. For a further explanation of dual-gate FETs see "Single-and Dual-Gate GaAs Schottky-Barrier FET's for Microwave Frequencies," by S. Asai, H. Kurono, S. Takahaski, M. Hirao and H. Kodera, Proc. of the 5th Conf., (1973 International) on Solid State Devices, Tokyo, 1973 Supplement to the Journal of the Japan Society of Applied Physics, Vol. 43, 1974 and "Performance of Dual-Gate GaAs MESFETs as Gain-Controlled Low-Noise Amplifiers and High Speed Modulators," by G. A. Liechti, ISSCC 75, WPM 7.2, Feb. 12, 1975.

The bias voltages for the biasing circuits to be described are conveniently supplied from a power source having separate voltage dividers to provide the different bias voltages. Such biasing circuits 44, 48, 52 and 56 are connected to terminals 46, 50, 54 and 58 respectively. Terminals 46, 50, 54 and 58 are further connected to voltage sources VG1, VG2, VDT and VD, respectively. Biasing circuits 44, 48, 52 and 56 are shown in detail in FIG. 3 and will be explained in detail below.

In a preferred embodiment of the invention, FET 26 and detector diode 40 are integrated on a single microwave integrated circuit (MIC) in a microstrip circuit configuration to minimize the number of electrical interconnections. Other transmission lines, such as, for example, coaxial line circuits, waveguide circuits and stripline circuits may also be used.

Figure 3:
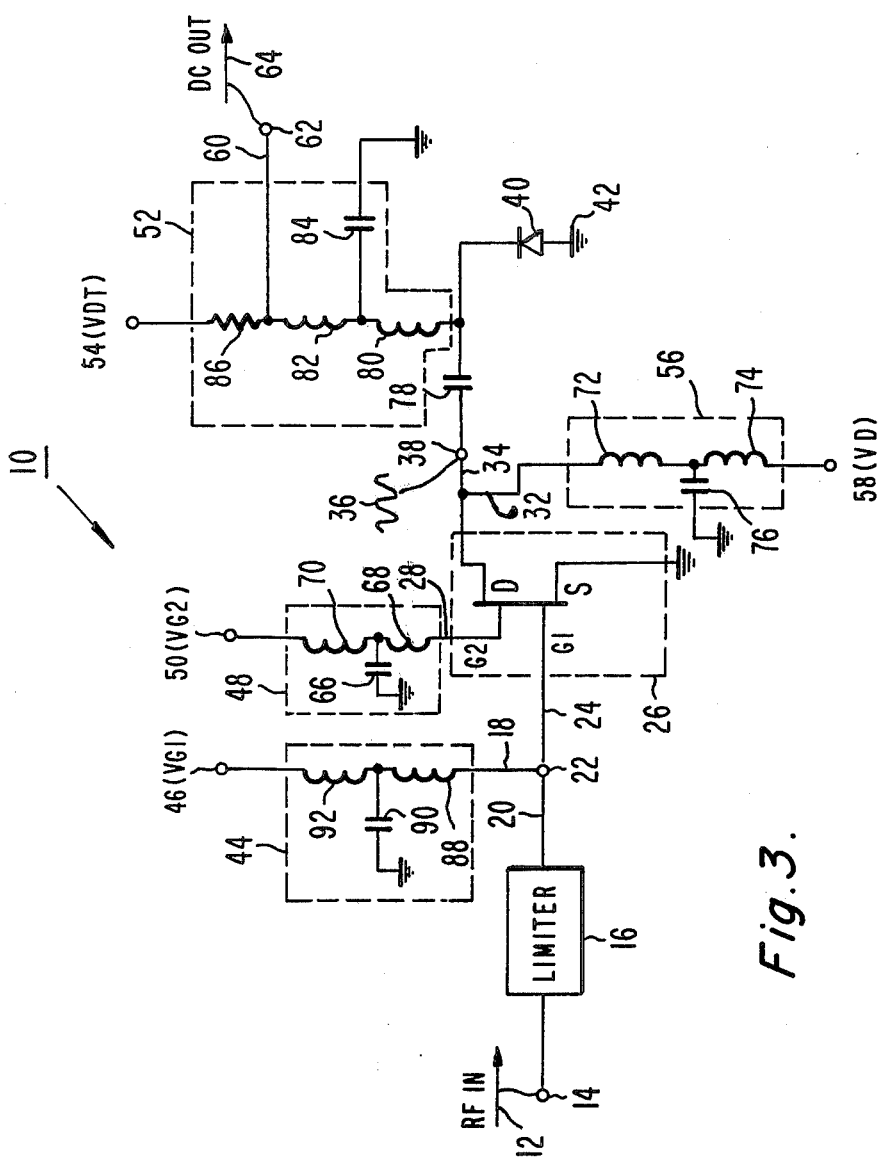
FIG. 3 is a schematic of the microwave discriminator of FIG. 1 according to a preferred embodiment of the invention.

In the preferred embodiment of the invention, as shown in FIG. 3, FET 26 has its four electrodes arranged as a first gate G1, a second gate G2, a source S and a drain D electrode. Gate G1 is connected to input port 22. Port 22 is connected to limiter 16 via a transmission line 20 and also to bias voltage VG1, via signal path 18 and biasing circuit 44.

Biasing circuit 44 provides the proper bias voltage VG1, having a representative value to be given hereinafter, for gate G1. Biasing circuit 44 comprising serially connected inductors 88 and 92 and a capacitor 90 shunted to ground also serves a filter network, bypassing the RF signal present on transmission line 20 from gate G1 bias voltage VG1.

Gate G2 is connected to bias voltage VG2 via biasing circuit 48. Biasing circuit 48, similar to bias circuit 44, provides the proper bias voltage VG2, having a representative value to be given hereinafter, for gate G2. Biasing circuit 48 comprising serially connected inductors 68 and 70 and a capacitor 66 shunted to ground also serves as a filter network bypassing the RF signal that may be present at gate G2 from gate G2 bias voltage VG2. By electronically changing the bias voltages VG1 and VG2 the transfer characteristic of the FET 26 is changed. The desired bias voltage for VG1 and VG2 must be individually selected for each FET 26 to provide the desired transfer characteristics. The selection of bias voltages VG1 and VG2 may be accomplished by monitoring the FET 26 transfer characteristics with a conventional network analyzer while adjusting the individual voltages VG1 and VG2. Electronic control of the bias voltages VG1 and VG2 is provided in accordance with the present invention to augment the FET roll-off characteristic such that the roll-off characteristic varies substantially linearly as a function of frequency. More specifically, the intrinsic property of an FET amplifier, having a frequency roll-off characteristic, is enhanced and linearized by the electronically variable bias voltages VG1 and VG2.

Drain electrode D is connected to bias voltage VD via drain biasing circuit 56. Biasing Circuit 56 is connected at terminal 58 to VD which may be a pulses or dc bias voltage (VD) to provide the proper biasing drain voltage VD, having a representative value to be given hereinafter, for drain D. Circuit 56, comprising serially connected inductors 72 and 74 and a capacitor 76 connected in shunt to ground also serves as a filter network, bypassing the RF signal 36 from the drain bias voltage VD.

According to the present invention, biasing circuit 52 is utilized to match the output impedance of FET 26 with the input impedance of detector diode 40. Under such conditions of matched impedances as provided by biasing circuit 52, the high frequency vs. gain roll-off characteristic of the FET 26 has a power-frequency response which is substantially linear throughout a predetermined frequency bandwidth. The high frequency vs. gain roll-off characteristic is augmented by the variable bias voltages VG1 and VG2 as explained above. Such a linear power-frequency response is converted by detector diode 40 to a substantially linear dc voltage vs. frequency approximating a linear discriminator characteristic through the predetermined frequency range from f1 to f2 as shown in FIG. 2. For example, in the practice of the invention the frequency range may be between 7GHz to 11GHz.

The detector biasing circuit 52 is electrically connected to the input (cathode) of detector diode 40 to bias the forward current through detector diode 40. Circuit 52 is connected at terminal 54 to VDT, which may be pulsed or dc voltage, to provide the detector 40 with a voltage for biasing the forward current. Circuit 52, comprising serially connected inductors 80 and 82, resistor 86 and a capacitor 84 connected to ground also serves as a filter network, bypassing the RF signal 36 from the detector bias voltage VDT. In this preferred embodiment, one terminal (anode) of detector 40 is connected to ground and the dc voltage output 64 is passed out by circuit 52 through terminal 62. In the configurations shown, the detector bias voltage VDT is negative. However, voltage VDT may be positive if the polarity of detector diode 40 is reversed. A blocking capacitor 78 is used to isolate the drain bias voltage VD from the detector bias voltage VDT.

According to this embodiment of the invention, the matching condition between the output impedance of FET 26 and the input impedance of detector diode 40 is a function of both the drain voltage and the forward current through detector diode 40. The desired matching condition is achieved electronically by the biasing drain voltage VD and forward detector current as by drain biasing circuit 56 and detector biasing circuit 52, respectively. Such biasing may be achieved with either biasing circuit alone or in combination, the combined biasing however providing a greater range of impedance condition variations. Furthermore, by applying to drain electrode D and detector 40, a variable voltage, the impedance conditions can be electronically varied to change the slope of the substantially linear dc voltage-frequency response of the discriminator.

As previously described, the linear power-frequency signal 36 of FET 26 is received by detector diode 40 and converted into a dc output signal 64 for subsequent processing (not shown). It is preferable that detector diode 40 be of the square law type. A square law detector has a characteristic $V_{out}=kV_{in}^2$, where k is the detector sensitivity factor such that the output dc voltage 64 will vary substantially linearly as a function of the input RF signal 36.

Representative values for the aforementioned circuit components and bias voltages and currents are given in the following Table I:

TABLE I

| Resistor | ohms |
|---|---|
| 86 | 10K |
| Capacitor | picofarards |

TABLE I-continued

| | |
|---|---|
| 66 | 40 |
| 76 | 40 |
| 78 | 15 |
| 84 | 40 |
| 90 | 40 |
| Inductor | microhenries |
| 68 | 10 |
| 70 | 10 |
| 72 | 10 |
| 74 | 10 |
| 80 | 10 |
| 82 | 10 |
| 88 | 10 |
| 92 | 10 |
| Bias Voltage | volts |
| VG1 | −1.0 |
| VG2 | +1.0 to −2.0v |
| VD | +1.0 to +6.0v |
| Bias Current | current |
| I detector (40) | 0–100 microamps |
| I drain (D) | 50–200 milliamps |

The microwave frequency discriminator 10 of the present invention as herein described achieves the desired linear frequency discriminator characteristic by utilizing an FET in the transmission line circuit. In contrast to the active device (FET) discriminators as disclosed in U.S. Pat. Nos. 4,053,841 and 4,053,842 in which both the input and output networks are designed with predetermined manually tunable impedances, the FET discriminator of the present invention achieves the desired input and output transistor impedance conditions electronically in both the input and output circuits without specifically configured shaping networks and manipulation of tuning elements. Also, in contrast to U.S. Pat. No. 4,110,700, the desired input impedance condition for the FET is achieved without the use of varactor device serving as an electronic variable capacitor. Elimination of the varactor increases the reliability of the frequency discriminator 10 while maintaining the desired performance characteristics. Such a frequency discriminator as herein described, provides for tunability in any operating environment by the use of the adjustable bias controls. It should be noted that the discriminator of the inventor is useful in providing a means to vary any one or more of four bias sources to achieve adjustment, tuning or modification of the discriminator characteristic.

For the purpose of the present disclosure, the term "passive" elements is intended to define the elements of the discriminator circuit coupling the input signal to the detector diode that are passive in the well known meaning of the word in this art. The term "active" elements is intended to define a discriminator network coupling the input signal to the detecting diode in which one or more of the elements are active. Thus the FET 26 included in the discriminator circuit defines such a circuit as being "active."

Although the invention can be used to scan for and detect signals of an unknown frequency in electronic counter-measure (ECM) systems, the invention can also be used in scanning for frequency modulated signals. The detector output will generate a dc signal representing the modulating signal.

What is claimed is:

1. A microwave frequency discriminator for input RF microwave frequency signals of substantially constant power level comprising:

a transistor amplifier including a dual-gate field effect transistor having first and second control gate electrodes and input and output electrodes; means coupled to said first control gate electrode and said input and output electrodes for separately biasing said electrodes at predetermined bias voltages that produce in response to said input RF signal at said first control gate electrode an output RF signal at said output electrode having a predetermined frequency versus gain roll-off characteristic over a predetermined frequency band;

means coupled to said second control gate electrode for biasing said second control gate electrode at a predetermined bias voltage in relation to the biasing of said first control gate electrode and said input and output electrodes that produces said output RF signal with a more linear frequency versus gain roll-off characteristic over said predetermined frequency band;

said first-mentioned biasing means including means coupled to said first control gate electrode for controlling the input impedance of said transistor and means coupled to said output electrode for controlling the output impedance of said transistor, said second-mentioned biasing means including means coupled to said second control gate electrode for further controlling the output impedance of said transistor;

detector means responsive to said output RF signal for producing a dc signal proportional to the amplitude of said output RF signal; and detector biasing means coupled to said detector means responsive to a predetermined bias voltage for controlling the input impedance of said detector means so as to provide matching with the output impedance of said transistor;

whereby at said conditions of matched impedances said dc signal varies substantially linearly as a function of the frequency of said input RF signal.

2. A microwave frequency discriminator according to claim 1, wherein said detector means comprises a square law detector.

3. A microwave frequency discriminator according to claim 1, wherein said predetermined bias voltages for said first and second control gate electrodes are variable, the slope of said substantially linear dc signal versus frequency response being adjustable with changes in said variable bias voltages.

4. A microwave frequency discriminator according to claim 1, wherein said detector biasing means comprises means for providing forward biasing current through said detector means to provide said impedance matching conditions.

5. A microwave frequency discriminator according to claim 1, including means for blocking the bias voltage at said output electrode from the bias voltage at said detector means.

6. A microwave frequency discriminator comprising:
signal limiting means responsive to an input RF signal of varying power level for generating an RF signal of substantially constant power level;

a transistor amplifier including a dual-gate field effect transistor having first and second control gate electrodes and input and output electrodes; means coupled to said limiting means for applying said RF signal of substantially constant power level to said first control gate electrode, means coupled to said first control gate electrode and said input and output electrodes for separately biasing these electrodes at predetermined bias voltages that produce in response to said RF signal of substantially constant power level at said first control gate electrode an output RF signal at said output electrode having a predetermined frequency versus gain roll-off characteristic over a predetermined frequency band;

means coupled to said second control gate electrode for biasing said second control gate electrode at a predetermined bias voltage in relation to the biasing of said first control gate electrode and said output electrode that produces said output RF signal with a more linear frequency versus gain roll-off characteristic over said predetermined frequency band;

said first-mentioned biasing means including means coupled to said first control gate electrode for controlling the input impedance of said transistor and means coupled to said output electrode for controlling the output impedance of said transistor, said second-mentioned biasing means including means coupled to said second control gate electrode for further controlling the ouput impedance of said transistor;

detector means responsive to said output RF signal for producing a dc signal proportional to the amplitude of said output RF signal; and detector biasing means coupled to said detector means responsive to a predetermined bias voltage for controlling the input impedance of said detector means so as to provide matching with the output impedance of said transistor, whereby at said conditions of matched impedances said dc signal varies substantially linearly as a function of the frequency of said input RF signal.

7. A microwave frequency discriminator according to claim 6, wherein said detector means comprises a square law detector.

8. A microwave frequency discriminator according to claim 6, wherein said predetermined bias voltages for said first and second control gate electrodes are variable, the slope of said substantially linear dc signal versus frequency response being adjustable with changes in said variable bias voltages.

9. A microwave frequency discriminator according to claim 6, wherein said detector biasing means includes means for biasing the forward current through said detector means to provide said impedance matching conditions.

10. A microwave frequency discriminator according to claim 6, including means for blocking the bias voltage at said output electrode from the bias voltage at said detector means.

* * * * *